United States Patent [19]

Lim

[11] Patent Number: 5,319,265

[45] Date of Patent: Jun. 7, 1994

[54] COMPARATOR WITH HYSTERESIS

[75] Inventor: Chang S. Lim, Puchon, Rep. of Korea

[73] Assignee: Samsung Electronics Co., Ltd., Kyungki-do, Rep. of Korea

[21] Appl. No.: 965,948

[22] Filed: Oct. 26, 1992

[30] Foreign Application Priority Data

Oct. 25, 1991 [KR] Rep. of Korea ............ 91-18872

[51] Int. Cl.$^5$ .......................... H03F 3/45; H03K 5/22
[52] U.S. Cl. .................................. 307/494; 307/290; 307/362; 307/493; 307/496; 307/498
[58] Field of Search ............ 307/290, 360, 493, 494, 307/496, 498, 562, 362

[56] References Cited

U.S. PATENT DOCUMENTS

| 3,631,262 | 12/1971 | Jarrett | 307/498 |
|---|---|---|---|
| 4,485,312 | 11/1984 | Kusakabe et al. | 307/290 |
| 4,539,491 | 9/1985 | Nishioka et al. | 307/494 |
| 4,581,545 | 4/1986 | Beale et al. | 307/290 |
| 4,694,198 | 9/1987 | Umeki | 307/290 |
| 4,710,793 | 12/1987 | Gray | 307/290 |
| 4,926,068 | 3/1990 | Fujita | 307/290 |
| 4,972,103 | 11/1990 | Barbu | 307/290 |
| 4,977,336 | 12/1990 | Martiny | 307/290 |
| 5,057,716 | 10/1991 | Küng | 307/494 |
| 5,166,550 | 11/1992 | Matsubara et al. | 307/494 |
| 5,262,682 | 11/1993 | Mitsuya et al. | 307/290 |

Primary Examiner—Timothy P. Callahan
Assistant Examiner—Terry D. Cunningham
Attorney, Agent, or Firm—Robert A. Westerlund; Charles R. Donohoe; Stephen R. Whitt

[57] ABSTRACT

A comparator with hysteresis in which a reference voltage of the comparator is easily adjustable. A resistor for dropping the reference voltage and a current source are coupled to a reference voltage terminal, and function to adjust the reference voltage in response to the level of an output voltage. Thus, the hysteresis voltage of the comparator can be easily adjusted by varying the current flowing through the resistor.

19 Claims, 2 Drawing Sheets

COMPARATOR WITH HYSTERESIS

BACKGROUND OF THE INVENTION

The present invention relates to a comparator and more particularly, to a comparator with adjustable hysteresis using a current mirror circuit.

As shown in FIG. 1, a conventional comparator with hysteresis using resistance ratio comprises a differential amplifier including a pair of transistors Q1 and Q2, the emitters of which are connected to each other and also connected to a resistor R2. An input terminal VIN and a reference voltage terminal (node A), whose reference voltage value is determined by the ratio of resistance values R3–R5, are connected to the differential pair of transistors Q1 and Q2. A transistor Q3 is connected to the common node between the resistors R4 and R5 through a resistor R6, and a transistor Q5 the base of which is connected to the collector of the transistor Q1, is connected between the base of the transistor Q3 and the power supply Vcc. Also, a transistor Q4, the base of which is connected to the base of the transistor Q3, is connected between load resistor R11 and the ground terminal (GND).

When the voltage of the output terminal VOUT of the comparator is low, that is, the voltage of the input terminal VIN is higher than the reference voltage at the node A, the reference voltage is defined as VthL. On the other hand, when the voltage of the output terminal VOUT of the comparator is high, that is, the voltage of the input terminal VIN is lower than the reference voltage, the reference voltage is defined as VthH. The hysteresis voltage $V_{hys}$ is VthH−VthL.

The hysteresis voltage VY, ca be calculated as follows:

$$VthL = \frac{R4 + (R56)}{R3 + R4 + (R56)} \times Vcc \quad (1)$$

$$VthH = \frac{R4 + R5}{R3 + R4 + R5} \times Vcc \quad (2)$$

$$Vhys = \left( \frac{R4 + R5}{R3 + R4 + R5} - \frac{R4 + (R56)}{R3 + R4 + (R56)} \right) \times Vcc \quad (3)$$

$$\text{where } R56 = \frac{R5 \times R6}{R5 + R6}$$

As described above, the conventional comparator with hysteresis shown in FIG. 1 achieves hysteresis using the resistance ratio, thereby complicating the calculation of the hysteresis voltage. That is, in order to satisfy Eq. (1), when the transistor Q3 is turned on, the collector-to-emitter voltage of the transistor Q3 must be zero. Accordingly, the hysteresis voltage has some error depending on the saturation voltage Vsat of the transistor Q3. Also, in order to increase the hysteresis voltage, the value of the resistor R6 has to be reduced. But, the reduction of the value of the resistor R6 increases the collector current of the transistor Q3, resulting in an increase of the saturation voltage Vsat of the transistor Q3. Thus, the error in the hysteresis voltage is increased.

Based upon the above, it can be appreciated that the conventional comparator with hysteresis has some disadvantages in that the accuracy of the hysteresis voltage is limited and the adjustment of the hysteresis voltage is difficult. Thus, it is evident that there presently exists a need for a comparator with hysteresis which has a hysteresis voltage which is both accurate and easily adjustable.

The present invention fulfills this need.

SUMMARY OF THE INVENTION

According to the present invention, there is provided a comparator with hysteresis comprising a differential amplifier circuit which includes a pair of transistors Q1 and Q2 the emitters of which are connected to each other and the bases of which are coupled to an input terminal VIN and a reference voltage terminal VREF, respectively; a resistor RB connected between the reference voltage terminal VREF and the base of one transistor Q2 of the differential pair, for dropping a reference voltage Vref; a current source IB consisting of a current mirror circuit; and, a switching portion for controlling current flow by switching the connection of the resistor RB and the current source IB.

Thus, a reference voltage source is serially connected to a variable voltage source and the variable voltage source is controlled by a switching circuit connected to an output voltage of the differential amplifier.

In the case where an external signal is utilized as a reference voltage source, it is preferable that the resistor be serially connected between the reference voltage input terminal and a reference terminal of the differential voltage amplifier, and the discretely controlled current source be connected to the reference terminal.

The current source may suitably be a current injection/absorption circuit which utilizes a bipolar transistor or a field effect transistor.

A substantial discrete variation can be realized by switching the driving transistor voltage on or of f The reference voltage may be adjusted by using saturation characteristics of the feedback amplifier, since the positive voltage amplifier acts as an antiphase current amplifier, during operation. By way of example, in the case of an open/collector amplifier comprising a single transistor, if its input voltage is increased, its base injection current is increased, and, simultaneously its collector injection current is also increased. That is, it provides positive current amplification, but if a pull-up resistor is connected to the collector, it becomes an antiphase voltage amplifier.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION OF THE INVENTION

Figure 1:
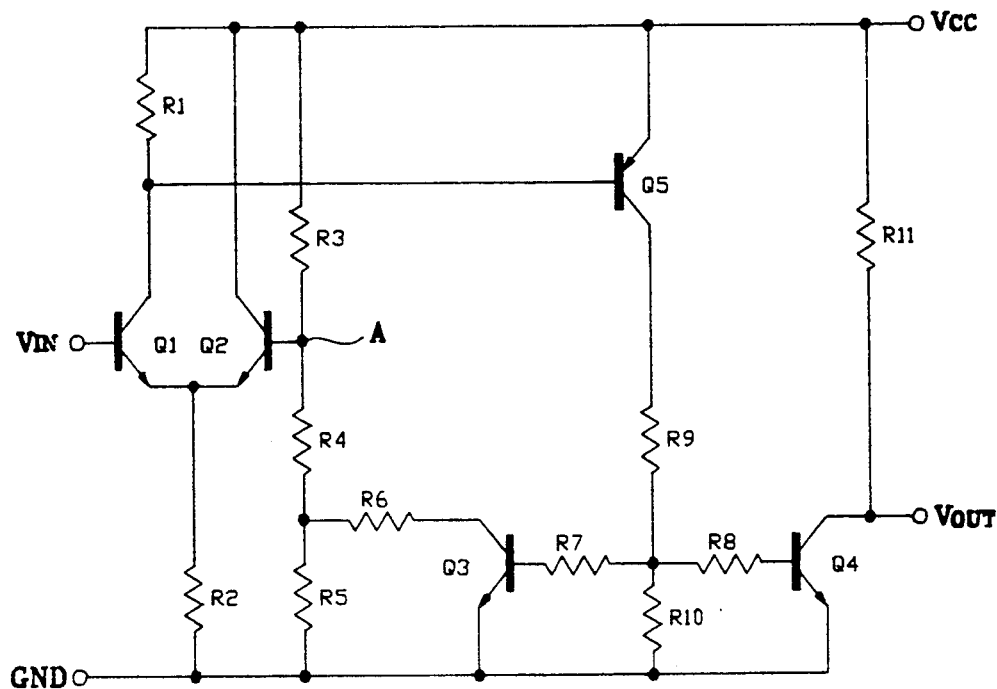
FIG. 1 is a schematic diagram of a conventional comparator with hysteresis.
Figure 2:
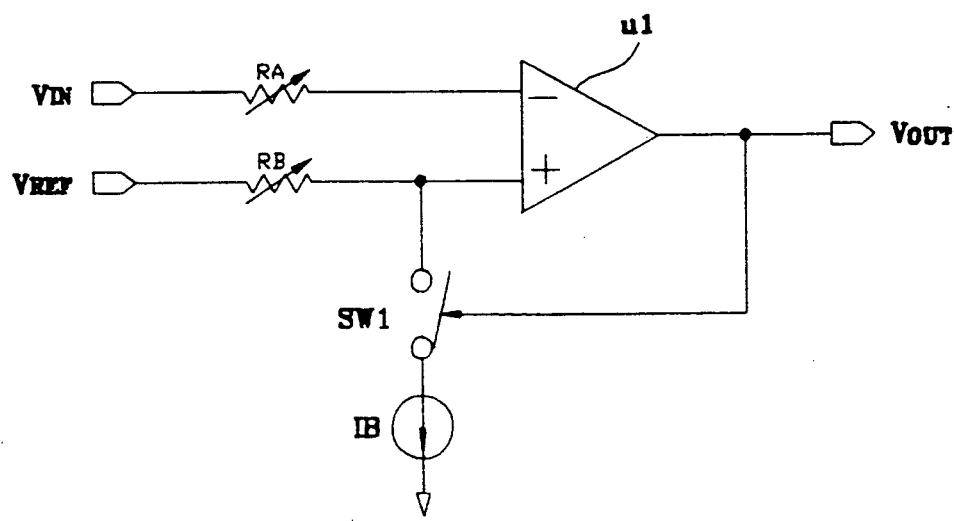
FIG. 2 is a functional schematic diagram of a comparator according to the present invention.

FIG. 2 is a functional schematic diagram of a comparator with hysteresis constructed in accordance with the present invention.

As shown in FIG. 2, an input terminal VIN and a reference voltage terminal VREF are connected to negative and positive input terminals of a differential amplifier U1 through resistors RA and RB, respectively. A switching portion SW1 and a current source IB are connected in series between the positive input terminal of the differential amplifier U1, and ground. The switching portion SW1 is switched by the output level of the differential amplifier U1, thereby controlling the current value of the current source IB. Thus, the current flow of the current source IB is controlled by the output level of the differential amplifier U1. The hysteresis voltage Vhys is determined by selectively dropping the voltage applied to the reference voltage terminal VREF.

Figure 3:
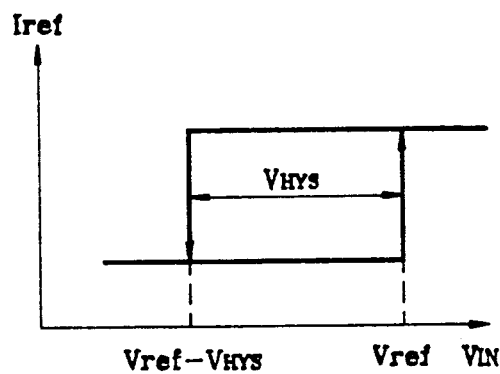
FIG. 3 graphically depicts the hysteresis characteristics of the comparator illustrated in FIG. 2; and, FIG. 4 is a detailed circuit diagram of the comparator shown in FIG. 2.

FIG. 3 illustrates hysteresis characteristics of the comparator shown in FIG. 2. Iref denotes the current value through the resistor RB; Vref is the reference voltage applied to the reference input terminal VREF; and, Vhys denotes the hysteresis voltage.

Figure 4:
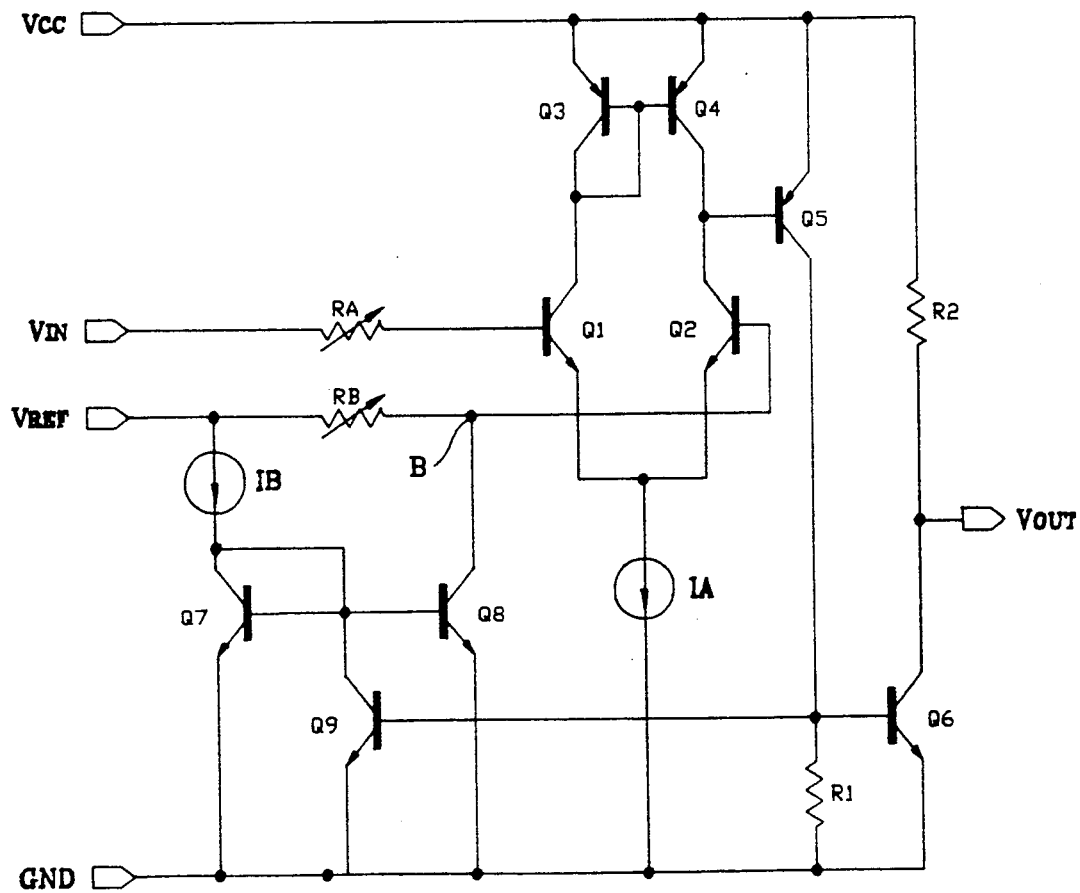

FIG. 4 is a detailed circuit diagram of the comparator depicted in FIG. 2.

The comparator according to the present invention comprises a differential amplifier which includes a pair of bipolar (e.g., NPN type) transistors Q1 and Q2 in which the base of the transistor Q1 is coupled to the input terminal VIN through the resistor RA and the base of the transistor Q2 is coupled to the reference voltage terminal VREF through the resistor RB. Also, the collectors of the transistors Q1 and Q2 are connected to a current mirror circuit which functions as the load circuit of the differential pair.

The current mirror circuit is comprised of bipolar (e.g., PNP) transistors Q3 and Q4, the emitters of which are connected to the power supply Vcc and the bases of which are connected to each other. Also, the base and collector of the transistor Q3 are connected to each other. The emitters of the transistors Q1 and Q2 of the differential amplifier are connected to each other and connected to ground through a current source IA.

In order to amplify the output voltage of the differential amplifier, transistors Q5 and Q6, which comprise a two-stage inverter circuit, are connected to a common node between the collectors of the transistors Q2 and Q4. The base of the transistor Q6 is connected to the collector of the transistor Q5, and biasing resistors R1 and R2 are connected to the base and the collector of the transistor Q6, respectively.

A current mirror circuit comprised of a current mirror IB and transistors Q7 and Q8, is connected between the opposite terminals of the resistor RB, and ground. Also, a transistor Q9 is commonly coupled to the gates of the transistors Q7 and Q8, in order to control the current of the current mirror circuit. The base of the transistor Q9 is connected to the base of the transistor Q6, and the emitter thereof is coupled to the collector of the transistor Q5, through the resistor R1. VOUT denotes the output terminal.

The threshold voltage of the comparator (the voltage at node B), when the output terminal VOUT of the comparator is at the low level, is defined as VthH, and when the output terminal VOUT of the comparator is at the high level, is defined as VthL.

When the output terminal VOUT of the comparator is at the low level, the transistor Q9 is turned on, and thus, there is no voltage drop across the resistor RB. Consequently, the reference voltage vref is applied to the base of the transistor Q2 without any voltage drop. At this time, the threshold voltage of the comparator, VthH, is Vref.

Conversely, when the output terminal VOUT of the comparator is at the high level, the transistor Q9 is turned off, and there occurs a voltage drop caused by the resistor RB and the current source IB and at this time, the threshold voltage of the comparator, VthL, becomes $Vref - RB \times IB$.

Thus, the hysteresis voltage Vhys is:

$$\begin{aligned} Vhys &= VthH - VthL \\ &= Vref - \{Vref - (IB \times RB)\} \\ &= IB \times RB \end{aligned}$$

Because the hysteresis voltage Vhys is determined by the current source IB and the resistor RB, the hysteresis voltage can be adjusted by varying the current value of the current source IB and the resistor RB, as shown in FIG. 3. When the resistor RB is a variable resistor, the hysteresis voltage Vhys can be easily adjusted, over a wide range of possible values.

Although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A comparator, comprising:
    a differential amplifier having a first input terminal, a second input terminal, and an output node, said differential amplifier being connected between a supply voltage and a reference potential;
    a first resistor connected between said first input terminal and an input signal;
    a second resistor connected between said second input terminal and a reference voltage;
    a current mirror circuit connected between opposite ends of said second resistor and said reference potential;
    an output voltage terminal;
    an output amplifier coupled between said output node of said differential amplifier and said output voltage terminal;
    a switch coupled between said current mirror circuit and said reference potential, said switch being responsive to the voltage at said output node for controlling the current value of said current mirror circuit, and thereby controlling the voltage at a node between said second resistor and said second input terminal of said differential amplifier.

2. The comparator as set forth in claim 1, wherein said current mirror circuit includes:
    a first bipolar transistor having a first electrode coupled to a first end of said second resistor, a base electrode, and a second electrode coupled to said reference potential;
    a second bipolar transistor having a first electrode coupled to a second end of said second resistor opposite said first end, a base electrode, and a second electrode coupled to said reference potential; and,
    wherein said base electrode of said first bipolar transistor and said base electrode of said second bipolar transistor are connected to each other.

3. The comparator as set forth in claim 2, wherein said switch comprises a switching bipolar transistor having a first electrode coupled to a first common node between said base electrode of said first bipolar transistor and said base electrode of said second bipolar transistor, a base electrode, and a second electrode coupled to said reference potential.

4. The comparator as set forth in claim 3, wherein said output amplifier includes a first amplifying bipolar transistor having a first electrode coupled to said output voltage terminal, a base electrode connected to said base electrode of said switching bipolar transistor, and a second electrode coupled to said reference potential.

5. The comparator as set forth in claim 4, wherein said voltage output terminal is coupled between said supply voltage and said first electrode of said first amplifying bipolar transistor.

6. The comparator as set forth in claim 5, wherein said output amplifier further includes a second amplifier bipolar transistor of opposite conductivity type as that of said first amplifying bipolar transistor, said second amplifying bipolar transistor including a first electrode coupled to said supply voltage, a base electrode coupled to said output node of said differential amplifier, and a second electrode coupled to a second common node between said base electrode of said first amplifying bipolar transistor and said base electrode of said switching bipolar transistor.

7. The comparator as set forth in claim 6, wherein said differential amplifier includes:
a first input responsive bipolar transistor having a first electrode, a base electrode connected to said said fist input terminal, and a second electrode;
a second input responsive bipolar transistor having a first electrode, a base electrode connected to said second input terminal, and a second electrode coupled to a said second electrode of said first input responsive bipolar transistor;
a first load device coupled between said supply voltage and said first terminal of said first input responsive bipolar transistor;
a second load device coupled between said supply voltage and said first electrode of said second input responsive bipolar transistor; and,
wherein a third common node between said second electrodes of said first and second input responsive bipolar transistors is coupled to said reference potential.

8. The comparator as set forth in claim 7, wherein said current mirror circuit further includes a first current source coupled between said first end of said second resistor and a node commonly connected to said first electrode of said first bipolar transistor and said first common node.

9. The comparator as set forth in claim 8, further including a second current source coupled between said third common node and said reference potential.

10. The comparator as set forth in claim 9, wherein said first current source comprises a current mirror.

11. The comparator as set forth in claim 10, further comprising a third resistor coupled between said second common node and said reference potential.

12. The comparator as set forth in claim 11, further comprising a fourth resistor coupled between said supply voltage and said output voltage terminal.

13. The comparator as set forth in claim 10, wherein said first load device comprises a first bipolar load transistor and said second load device comprises a second bipolar load transistor.

14. The comparator as set forth in claim 13, wherein:
said first bipolar load transistor includes a first electrode coupled to said supply voltage, a base electrode, and a second electrode coupled to said first electrode of said first input responsive bipolar transistor;
said second bipolar load transistor includes a first electrode coupled to said supply voltage, a base electrode connected to said base electrode of said first bipolar load transistor, and a second electrode coupled to said first electrode of said second input responsive bipolar transistor;
wherein said second electrode of said first bipolar load transistor is coupled to a fourth common node between said base electrodes of said first and second bipolar load transistors;
wherein said output node comprises a fifth common node between said second electrode of said second bipolar load transistor and said first electrode of said second input responsive bipolar transistor; and,
wherein said first and second bipolar load transistors are of a conductivity type which is opposite that of said first and second input responsive bipolar transistors, and the same as that of said second amplifying bipolar transistor.

15. The comparator as set forth in claim 14, wherein said second resistor is a variable resistor.

16. The comparator as set forth in claim 15, wherein said first resistor is a variable resistor.

17. The comparator as set forth in claim 16, wherein said reference potential is ground.

18. The comparator as set forth in claim 1, wherein said second resistor is a variable resistor.

19. The comparator as set forth in claim 18, wherein said first resistor is a variable resistor.

* * * * *